(12) United States Patent
Bierret et al.

(10) Patent No.: US 11,171,174 B2
(45) Date of Patent: Nov. 9, 2021

(54) DEVICE AND METHOD FOR MULTISPECTRAL IMAGING IN THE INFRARED

(71) Applicants: OFFICE NATIONAL D'ETUDES ET DE RECHERCHES AEROSPATIALES (ONERA), Palaiseau (FR); CENTRE NATIONAL DE LA RECHERCHE SCIENTIFIQUE (CNRS), Paris (FR)

(72) Inventors: Antoine Bierret, Versailles (FR); Grégory Vincent, Massy (FR); Riad Haidar, Paris (FR); Fabrice Pardo, Vitry-sur-Seine (FR); Jean-Luc Pelouard, Paris (FR)

(73) Assignees: OFFICE NATIONAL D'ETUDES ET DE RECHERCHES AEROSPATIALES (ONERA), Palaiseau (FR); CENTRE NATIONAL DE LA RECHERCHE SCIENTIFIQUE (CNRS), Paris (FR)

(*) Notice: Subject to any disclaimer, the term of this patent is extended or adjusted under 35 U.S.C. 154(b) by 89 days.

(21) Appl. No.: 16/603,174

(22) PCT Filed: Apr. 6, 2018

(86) PCT No.: PCT/EP2018/058822
§ 371 (c)(1),
(2) Date: Oct. 30, 2019

(87) PCT Pub. No.: WO2018/185265
PCT Pub. Date: Oct. 11, 2018

(65) Prior Publication Data
US 2020/0066782 A1    Feb. 27, 2020

(30) Foreign Application Priority Data

Apr. 6, 2017 (FR) ..................... 1753017

(51) Int. Cl.
*H01L 27/146* (2006.01)
*G01J 3/36* (2006.01)
*G01J 3/28* (2006.01)

(52) U.S. Cl.
CPC .......... *H01L 27/14652* (2013.01); *G01J 3/36* (2013.01); *H01L 27/14625* (2013.01); *G01J 2003/2806* (2013.01)

(58) Field of Classification Search
CPC ......... H01L 27/14652; H01L 27/14625; H01L 27/14649; H01L 27/14621; G01J 3/36;
(Continued)

(56) References Cited

U.S. PATENT DOCUMENTS 3,971,065 A   7/1976  Bayer
7,807,951 B1  10/2010 O'Neill et al.
(Continued)

FOREIGN PATENT DOCUMENTS

EP    2 616 855 A1    7/2013
WO    2009/106316 A2  9/2009
WO    2012/035110 A1  3/2012

OTHER PUBLICATIONS

Lequime et al., "2 > 2-Array Pixelated Optical Interference Filter s", Proc. SPIE vol. 9627, 96270V-1-96270V-7, 2015.
(Continued)

*Primary Examiner* — Thanh Luu
*Assistant Examiner* — Monica T Taba
(74) *Attorney, Agent, or Firm* — BakerHostetler

(57) ABSTRACT

A device for multispectral imaging in the infrared, suitable for detecting at at least one first and one second detection wavelength is provided. It comprises a detection matrix array comprising a set of elementary detectors of preset dimensions forming an image field of given dimensions; and an image-forming optic having a given aperture number (N)
(Continued)

and a given focal length (F), which aperture number and focal length are suitable for forming, at any point of the image field, an elementary focal spot covering a set of at least two juxtaposed elementary detectors. The device furthermore comprises a matrix array of elementary metal-dielectric guided-resonance filters, which matrix array is arranged in front of the detection matrix array at a distance smaller than a focal depth of the optic, the dimensions of the elementary filters being such that each elementary focal spot formed at each point of the image field covers at least two elementary filters; and the elementary filters are optimised for pass-band transmission in spectral bands centred on two different central wavelengths, equal to two of said detection wavelengths.

9 Claims, 7 Drawing Sheets

(58) Field of Classification Search
CPC ...... G01J 2003/2806; G02B 3/0006; G02B 5/201
See application file for complete search history.

(56) References Cited

U.S. PATENT DOCUMENTS

| | | | |
|---|---|---|---|
| 10,795,174 B1* | 10/2020 | Magnusson | G02B 5/203 |
| 2004/0108564 A1 | 6/2004 | Mitra | |
| 2013/0277560 A1 | 10/2013 | Robinson | |
| 2013/0342680 A1* | 12/2013 | Zeng | H04N 5/332 |
| | | | 348/135 |
| 2014/0291480 A1* | 10/2014 | Bruder | G01S 17/89 |
| | | | 250/206 |
| 2016/0146989 A1* | 5/2016 | Sakat | G02B 5/22 |
| | | | 250/349 |

OTHER PUBLICATIONS

Oussalah et al., "Multispectral thin film coating on infrared detector", Proc. SPIE., vol. 9627, 96271W-96271W-10, (2015).
Haidar et al., "Free-standing subwavelength metallic gratings for snapshot multispectral imaging", Appl. Phys. Lett. 96, 221104, (2010).
Sakat et al., "Guided mode résonance in subwave length metallodielectric free-standing grating for bandpass filtering", Opt. Lett. 36, 3054 (2011).
Sakat et al., "Metal-dielectric bi-atomic structure for angular-tolerant spectral filtering", Opt. Lett., 38, 425, (2013).
Moharam, et al., "Formulation for stable and efficient implementation of the rigorous coupled-wave analysis of binary gratings", J. Opt. Soc. Am., A/vol. 12, No. 5, pp. 1068-1076, May 1995.
Hugonin, et al., "RETICOLO software grating analysis", Institut d'Optique, Orsay, France, 2005.
Tardieu, et al., "Extraordinary optical extinctions through dual metallic gratings", Optics Letters, vol. 40, No. 4, pp. 661-664, Feb. 15, 2015.
Shokooh-Saremi, et al., "Particle swarm optimization and its application to the design of diffraction grating filters", Optics Letters, vol. 32, No. 8, pp. 894-896, Apr. 15, 2007.
Tuambilangana, et al., "Two-mode model for metal-dielectric guided-mode resonance filters", Optics Express, vol. 23, No. 25, pp. 31672-31681, Dec. 14, 2015.

* cited by examiner

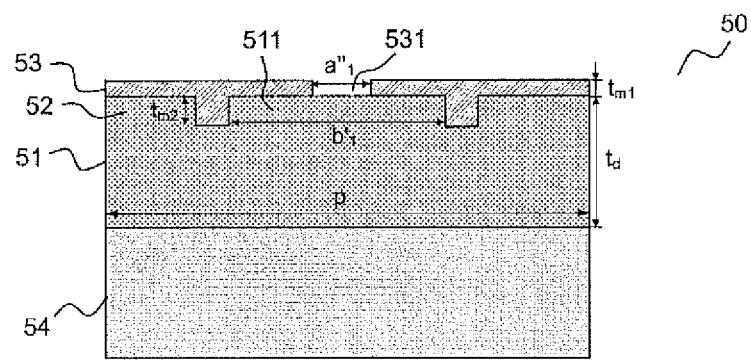
FIG.5A
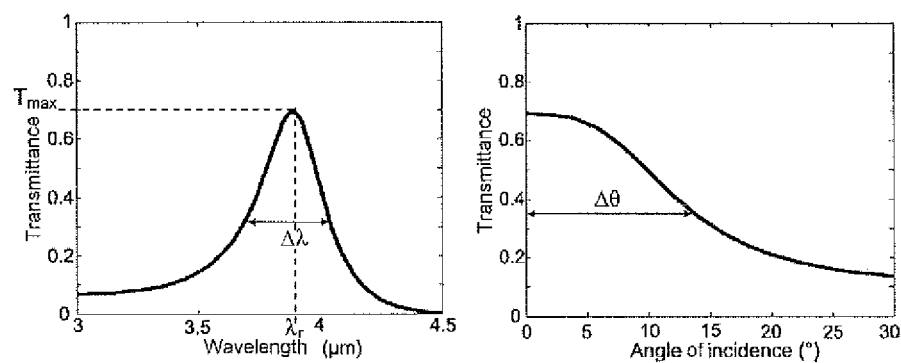
FIG.5B
FIG.5C

DEVICE AND METHOD FOR MULTISPECTRAL IMAGING IN THE INFRARED

CROSS-REFERENCE TO RELATED APPLICATIONS

This application is a National Stage of International patent application PCT/EP2018/058822, filed on Apr. 6, 2018, which claims priority to foreign French patent application No. FR 1753017, filed on Apr. 6, 2017, the disclosures of which are incorporated by reference in their entirety.

PRIOR ART

Technical Field

The present invention relates to a device and method for multispectral imaging in the infrared.

Prior Art

In the visible or the near infrared, various means are known for forming color images by means of CCD or CMOS digital cameras. It is possible for example to use spectral splitting means to form, on a plurality of detectors, images respectively in various spectral bands. It is also known to place a filter wheel in front of the camera and to sequentially acquire a series of images in various spectral bands. In each of these cases, the color image is reconstructed from the various images acquired in the various spectral bands. The most widely used technique is however structuring of the focal plane to form a mosaic of pixelated filters, for example in the form of a so-called "Bayer array" (which is described in U.S. Pat. No. 3,971,065) which allows images in various spectral bands to be acquired simultaneously and with a single detector with a view to reproducing, as closely as possible, the vision of the human eye. To do so, red, green and blue filters are positioned level with each of the elementary detectors of the camera (or pixels) in the form of a mosaic of 4 pixelated filters (one red, 2 green, one blue), this pattern being reproduced over the entire surface of the detector. A "demosaicing" algorithm then allows the color image to be reconstructed. Pixelated filters are generally produced in the near infrared in the form of multilayer structures forming interference filters (see for example M. Lequime et al. "2×2-*Array Pixelated Optical Interference Filters*", Proc. SPIE Vol. 9627, 96270V-1-96270V-7, 2015), this technology being very well known. In the visible, it is also possible to use dyes.

In the infrared, i.e. for wavelengths typically comprised between 3 µm and 20 µm, there is also a need for multispectral imaging, not to reproduce an image similar to that detected by the eye, but to access a wide range of information, such as for example the identification of a chemical species or of an object by virtue of its spectral signature, the thermal analysis of a radiating body, the determination of the spectral emissivity of a body, etc.

The use of multilayer structures for multispectral infrared imaging in the 3-5 µm band has been described, but it has a certain number of limitations (see M. Oussalah et al. "*Multispectral thin film coating on infrared detector*", Proc. SPIE, Vol. 9627, 96271W-96271W-10, (2015)). In particular, these components, if they are formed from a high number of layers, and if the materials are not chosen with great care, may exhibit fragility when subjected to temperature variations. Moreover, in the infrared, the thicknesses of the layers are large (typically larger than 1 µm) and variable from one filter to the next. This not only leads to technological difficulties, but may result in a deterioration in the performance in terms of spectral selectivity because of parasitic diffraction effects (edge effects) in particular resulting from filter-to-filter thickness differences.

Other techniques have been developed for multispectral imaging in the infrared, these techniques being based not on a stack of layers but on metal layers structured with periodic sub-wavelength structures, this in particular allowing a limited number of layers to be worked with.

Thus, Haïdar et al. ("*Free-standing subwavelength metallic gratings for snapshot multispectral imaging*", Appl. Phys. Lett. 96, 221104, (2010)) describes a multispectral infrared camera based on the use of suspended subwavelength metallic gratings. These structures have noteworthy transmittances at wavelengths that depend on the period. By juxtaposing a plurality of filters of different periods, it is thus possible to produce a camera having a plurality of imaging optical channels, each channel furthermore comprising a spectral filter, this allowing, for each channel, an image to be formed in a given area, typically a millimeter-sized area, in a given spectral band.

FIG. 1 thus illustrates a multichannel infrared camera 10 according to the prior art. The camera comprises a set of lenses, or micro-lenses, for example arranged in a chamber 11. These lenses, which are referenced 12a, 12b, 12c and 12d in FIG. 1, are suitable for forming images on a detection matrix array 13 formed of elementary detectors (or pixels) 13i. A matrix array 14 of filters suitable for filtering in transmission in spectral bands centered on given detection wavelengths is located upstream of each of the lenses 12i, for example level with an entrance window of the chamber 11. By choosing, for each of the filters, which are referenced 14a, 14b, 14c and 14d in FIG. 1, transmission spectral bands centered on different detection wavelengths, 4 different "colored" images are formed on the matrix array 13 of elementary detectors, in detection areas typically of millimeter-sized dimensions. A read circuit 15 is suitable for processing the signals detected for each of the images and for transmitting the signals to a computational unit (not shown). Thus, a "multichannel" camera is spoken of.

In Sakat et al. 2011 ("Guided mode resonance in subwavelength metallodielectric free-standing grating for bandpass filtering", Opt. Lett. 36, 3054 (2011)) and Sakat et al. 2013 (Metal-dielectric bi-atomic structure for angular-tolerant spectral filtering, Opt. Lett., 38, 425, (2013)), metallodielectric guided-mode-resonance (GMR) filters are described. These filters are based on a guided-mode resonance in a thin dielectric layer, the coupling of which to free space is ensured by a metallic grating, in particular for the orders ±1 diffracted in the dielectric. With respect to the structures described in Haïdar et al., these filters may have a better angular tolerance (see Sakat et al. 2013), this making it possible, when they are installed in a multichannel-camera configuration such as illustrated in FIG. 1, to work with larger fields while preserving the spectral performance of the filters.

However, in filters based on periodic sub-wavelength structures such as described above, only the response of the GMR filters to plane waves is considered, possibly as a function of the angle of incidence of this wave, for a use over large areas (typically millimeter-sized areas), such as in the multi-channel camera illustrated in FIG. 1.

For the first time, in the present patent application, the feasibility of a device for multispectral imaging in the infrared with metallo-dielectric GMR filters having areas of the size of the detection pixel is demonstrated, opening the way to new compact imagers for acquiring "color" infrared images instantaneously.

SUMMARY

According to a first aspect, the present description relates to a device for multispectral imaging in the infrared suitable for detecting at least one first and one second detection wavelength, comprising:
- a detection matrix array comprising a set of elementary detectors of preset dimensions forming an image field of given dimensions;
- an image-forming optic having a given aperture number and a given focal length, said number and length being suitable for forming, at every point of the image field, an elementary focal spot, said focal spot covering a set of at least two juxtaposed elementary detectors;
- a matrix array of elementary metallo-dielectric guided-mode-resonance filters, said matrix array being arranged in front of the detection matrix array at a distance smaller than a focal depth of the image-forming optic, the dimensions of the elementary filters being chosen so that each elementary focal spot formed at each point of the image field covers at least two elementary filters, said elementary filters being optimized for passband transmission in spectral bands centered on two different central wavelengths, equal to two of said detection wavelengths.

An elementary metallo-dielectric guided-mode-resonance filter optimized for passband transmission in a spectral band centered on a given detection wavelength $\lambda_d$ comprises, in the context of the present description, a layer made of dielectric material forming a waveguide that is able to support only a single mode at said detection wavelength $\lambda_d$, and at least one metallic diffraction grating structured with a given pattern repeated with a given period that is lower than said detection wavelength. At least one diffraction grating is suitable for coupling an incident wave at said detection wavelength $\lambda_d$ to the mode of the waveguide.

According to one or more examples of embodiments, a structuring pattern of the diffraction grating comprises one or more apertures, of preset dimensions, the apertures being filled with a dielectric material that may be ambient air or another dielectric material such as for example the dielectric material forming the waveguide that forming a substrate. The apertures may take the form of one-dimensional slits of given widths, slits of given widths arranged in two perpendicular directions (cross shapes), or may be circular apertures, etc. Depending on the geometry of the aperture, the elementary filter may or may not exhibit polarization selectivity.

The applicants have demonstrated that the behavior of the elementary metallo-dielectric guided-mode-resonance filters is such that, when an area thereof of dimensions of a few periods is illuminated with a convergent beam, they exhibit unexpected noteworthy properties, making it possible to realize "pixelated" elementary filters, i.e. filters the dimensions of which are of the order of magnitude of those of each elementary detector or pixel.

As known, the shape and size of the focal spot at a given point of the field and the field depth (or image field depth) depend on the opto-geometric characteristics of the image-forming optic and on the wavelength. For the estimation of the dimensions of the focal spot and of the focal depth, a preset wavelength value, for example the wavelength $\lambda_{min}$ corresponding to the minimum wavelength that it is sought to detect with the device for multispectral imaging in the infrared, will possibly be used.

For example, for an axisymmetric image-forming optic, the size of the diameter of the focal spot will possibly be set to the diameter $\Phi$ given by the diffraction limit at a given wavelength $\lambda$, for example the minimum detection wavelength.

According to one or more examples of embodiments, at least one of said elementary filters has an angular acceptance higher than or equal to a preset value depending on the opto-geometric parameters of the device, for example the opto-geometric parameters of the image-forming optic and/or of the detection matrix array.

The angular acceptance $\Delta\theta$ of an elementary filter is defined, in the present description, by the angle of incidence of a plane wave incident on the filter with a given inclination, measured with respect to a direction normal to the filter, and for which the maximum transmittance is equal to half the maximum transmittance of an identical plane wave incident on the filter with an angle of incidence of zero (normal incidence).

According to one or more examples of embodiments, said preset value is the field-edge angle of the device, which is defined as the angle of the most inclined ray intended to reach the matrix array of elementary detectors with respect to the direction normal to said matrix array of elementary detectors. This angle depends on the size of the matrix array of elementary detectors, on the aperture number and on the focal length of the image-forming optic.

According to one or more examples of embodiments, each of said elementary filters of the matrix array of elementary filters has an angular acceptance higher than or equal to the field-edge angle of the device. Specifically, even if the angular acceptance required for an elementary filter is lower at the center of the image field, it is possible to decide to optimize all the elementary filters of the matrix array of elementary filters to obtain the highest angular acceptance, i.e. that required for an elementary filter positioned at the image-field edge.

According to one or more examples of embodiments, each of said elementary filters has dimensions substantially identical to those of an elementary detector. In practice, as recalled above, an elementary metallo-dielectric guided-mode-resonance filter comprises a waveguide made of dielectric material and at least one metallic grating structured with a given pattern, which is repeated with a given period. The dimension of an elementary filter is therefore a multiple of the dimension of a pattern and will possibly be a little larger or a little smaller than that of an elementary detector. Thus, by substantially identical dimensions what is meant is that the difference between a dimension of an elementary filter and that of an elementary detector (pixel) is smaller than the central wavelength of the transmission spectral band of the filter. It is however possible for an elementary filter to have a dimension equal to several times that of a pixel, for example between 2 and 4 times.

According to one or more examples of embodiments, the elementary filters of the matrix array of elementary filters are arranged in the form of zones, each zone comprising at least two elementary filters optimized for passband transmission in spectral bands centered on two different central wavelengths, and each zone having dimensions larger than those of the focal spot. According to one or more examples of embodiments, the arrangement of the elementary filters is identical in each zone.

According to one or more examples of embodiments, the matrix array of elementary filters comprises at least one elementary dual-metallic-grating (DMG) guided-mode-resonance filter optimized for passband transmission in a spectral band centered on a given detection wavelength $\lambda_d$, comprising a layer made of dielectric material forming a waveguide that is able to support only a single mode at said detection wavelength $\lambda_d$, and two metallic diffraction gratings arranged on either side of the layer made of dielectric material. Each metallic grating is structured with a given pattern that is repeated with a given period, which is lower than the detection wavelength, and is suitable for coupling an incident wave at said detection wavelength wavelength $\lambda_d$ to the mode of the waveguide. Advantageously, the periods of both gratings are identical.

According to one or more examples of embodiments, the elementary DMG guided-mode-resonance filter is suspended and the two metallic gratings of the elementary filter are identical (same metal, same pattern, same period).

According to one or more examples of embodiments, the elementary DMG guided-mode-resonance filter is deposited on a substrate made of dielectric material and the patterns of the two metallic gratings of the elementary filter are different, in order to take into account differences in the refractive index of the dielectric materials on either side of the waveguide (air and substrate for example). Advantageously, the periods of both gratings remain identical.

According to one or more examples of embodiments, the matrix array of elementary filters comprises at least one elementary guided-mode-resonance filter of "bi-atomic" type, in which at least one metallic grating has a pattern with at least two apertures of different dimensions, for example two slits of different widths.

According to one or more examples of embodiments, the matrix array of elementary filters comprises at least one elementary guided-mode-resonance filter with a single metallization on its front face, said filter comprising a waveguide made of dielectric material with, on one side, a substrate and, on the other side, a double metallic grating, the gratings having a different pattern and, according to one or more examples of embodiments, an identical period.

In each of the aforementioned examples, all the elementary metallo-dielectric guided-mode-resonance filters of the matrix array of elementary filters may be identical or, in contrast, it is possible for the elementary filters to change, for example between the edge and center of the field.

According to one or more examples of embodiments, the elementary filters of the matrix array of elementary filters are arranged on the same substrate, this facilitating the manufacture thereof. They may also be suspended.

According to a second aspect, the present description relates to a method for multispectral imaging in the infrared suitable for detecting at least one first and one second wavelength, comprising:
  forming an image of a scene by means of an image-forming optic of given aperture and acquiring said image by means of a detection matrix array comprising a set of elementary detectors of preset dimensions forming an image field of given dimensions, the image-forming optic forming at every point of the image field an elementary focal spot covering a set of at least two juxtaposed elementary detectors;
  filtering light beams focused by said image-forming optic by means of a matrix array of elementary metallo-dielectric guided-mode-resonance filters, said matrix array being arranged in front of the detection matrix array at a distance smaller than a focal depth of the image-forming optic so that each elementary focal spot formed at each point of the image field covers at least two elementary filters, said elementary filters being optimized for passband transmission in spectral bands centered on two different central wavelengths, equal to two of said detection wavelengths.

BRIEF DESCRIPTION OF THE DRAWINGS

Other advantages and features of the invention will become apparent on reading the description, which is illustrated by the following figures:

FIG. 5A shows an example of an embodiment of an on-substrate metallo-dielectric GMR filter with a single metallization on its front face, said filter being suitable for a device for multispectral imaging in the infrared according to the present description; and FIGS. 5B and 5C show two curves of results of simulations of transmittance as a function of wavelength and as a function of angle of incidence (with plane waves) in the case of an example of an on-substrate filter with a front-face metallization (FIG. 5A);

DETAILED DESCRIPTION

Figure 1:
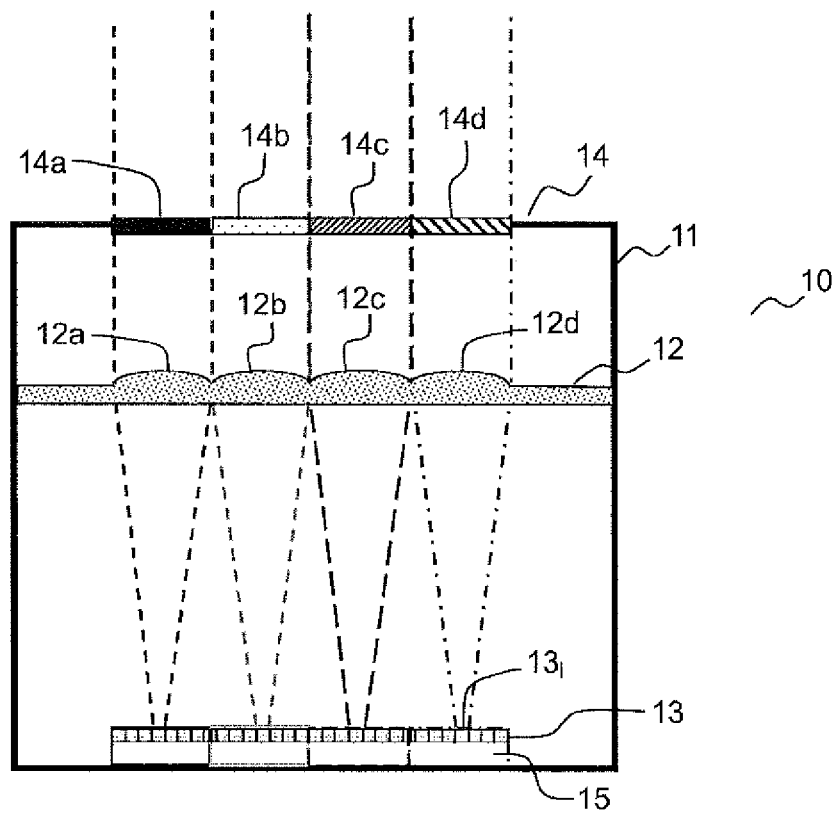
FIG. 1, which has already been described, shows a multichannel infrared camera according to the prior art.
Figure 2A:
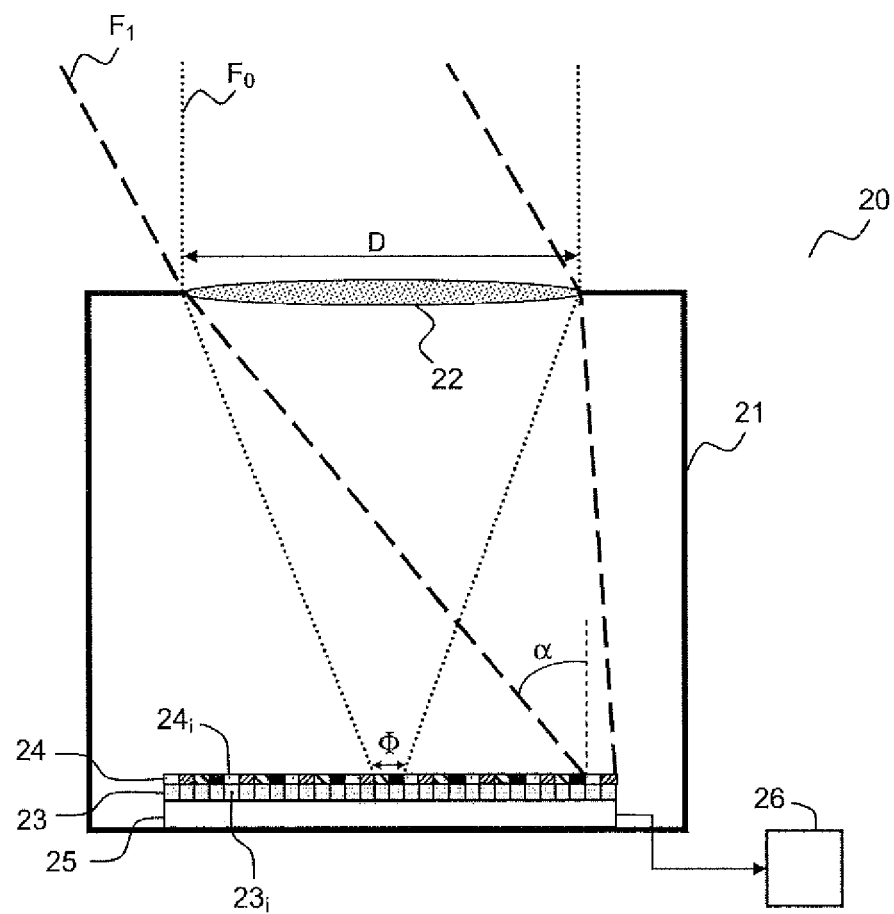
FIG. 2A shows a schematic of a device for multispectral imaging in the infrared according to one example of the present description.

FIG. 2A illustrates an example of a device for multispectral imaging in the infrared according to the present description. By multispectral imaging, what is meant is the formation of images at at least two different detection wavelengths, or more precisely in at least two detection spectral bands centered on two different detection wavelengths. The infrared spectral band is defined in the present description as all of the wavelengths comprised between 1 µm and 15 µm.

Figure 2B:
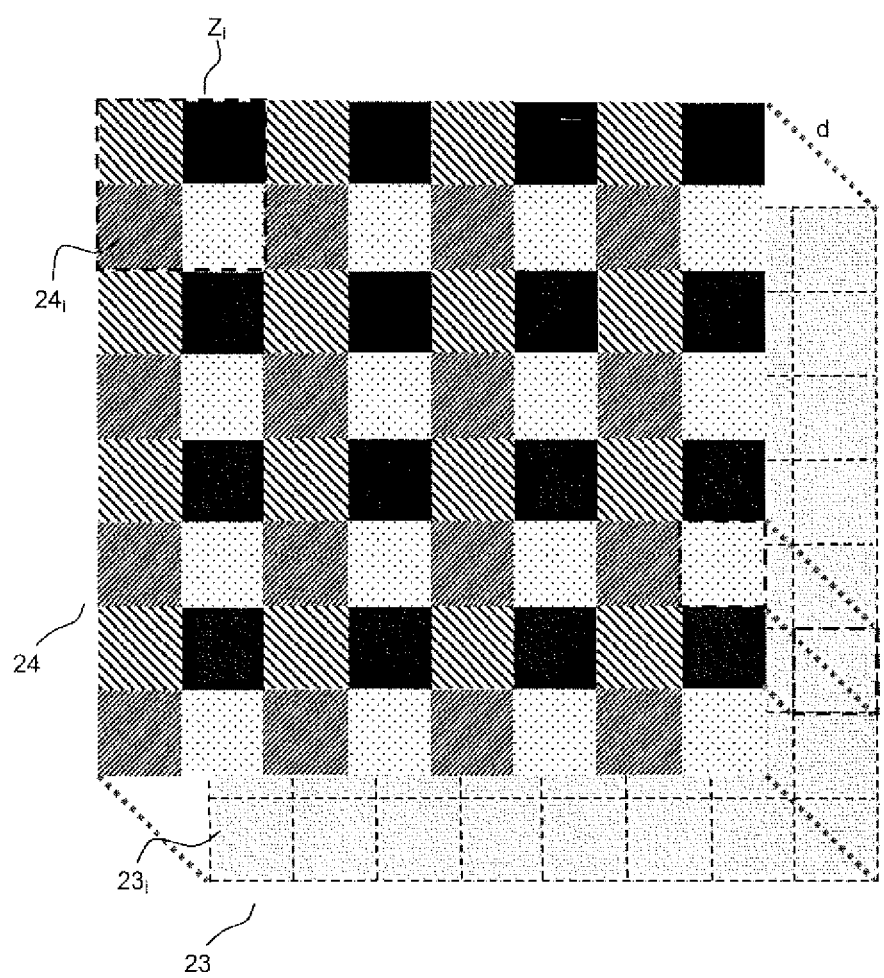
FIG. 2B shows an example of an arrangement of elementary metallo-dielectric guided-mode-resonance filters in a matrix array of elementary filters, said matrix array being suitable for a device for multispectral imaging in the infrared according to the present description.

The device for multispectral imaging in the infrared, referenced 20 in FIG. 2A, comprises, for example in a chamber 21, a detection matrix array 23 comprising a set of elementary detectors 23$i$, or pixels, of preset dimensions, a read circuit 25 for processing the signals delivered by the elementary detectors 23$i$, a processing unit 26 connected to the read circuit 25 and a matrix array 24 of elementary metallo-dielectric guided-mode-resonance filters 24$i$ an example of which is illustrated in FIG. 2B. The device for multispectral imaging in the infrared furthermore comprises an image-forming optic 22 arranged in the chamber or outside of the chamber and suitable for forming images in the infrared.

The detection matrix array suitable for the infrared may comprise any type of known matrix-array detector (1D strip or 2D detector), such as for example MCT (for mercury cadmium tellurium), InAs, (AlGAAs/As/GaAs) QWIP or (InAs/GaSb) super-grating detectors, these detectors operating in a cooled chamber 21. Other types of detectors suitable for operating in an uncooled environment may also be used, such as for example micro-bolometers.

Typically, for operation of the multispectral imaging device between 1 µm and 50 µm, elementary detectors of dimensions comprised between 15 µm and 30 µm will possibly be used, said elementary detectors being arranged in a detection strip (for example in a 288×4 pixel format) or in a two-dimensional matrix array (for example in a 640× 480 pixel format). The dimensions of the detection matrix array define those of the image field of the image-forming device.

The image-forming optic 22 is characterized by an aperture number N and a focal length F, with N equal to D/F, where D is the diameter of the pupil of the image-forming optic. The image-forming optic may comprise one or more lenses, made of materials that are transparent at the wavelengths of interest, and for example of germanium.

The image-forming optic 22 is suitable for forming images of a scene on the detection matrix array 23. In practice, as with any optical system, it is possible to define, for the image-forming optic, at a given wavelength, an elementary focal spot at a point in the image field and a focal depth.

The shape and size of the focal spot at a given point in the field and the focal depth (or image field depth) are defined, as known, at a given wavelength, by the opto-geometric characteristics of the image-forming optic.

For example, for an axisymmetric image-forming optic, the diameter $\varphi$ of the focal spot may be defined by the diffraction limit, namely:

$$\varphi = 2.44\lambda N \quad (1)$$

where N is the aperture number of the image-forming optic (N=D/F, with D the diameter of the pupil of the image-forming optic and F the focal length) and $\lambda$ is the wavelength. Thus, for example, in the case of a spectral imaging device with an aperture number N=3 and for a wavelength $\lambda$=4.1 µm, the diameter of the focal spot is about 30 µm.

Moreover, the focal depth, or image field depth, essentially depends on the aperture number of the optic used and on the wavelength. It may be defined as the interval, measured in the image space, in which the matrix array of detectors must be placed in order to obtain a clear image.

For example, an estimate of the focal depth $P_f$ may be given by:

$$P_f = 2N\varphi \quad (2)$$

Thus, for an aperture number N=3 and a focal spot $\varphi$=30 µm, a focal depth $P_f$=180 µm is obtained.

In practice, according to the present description, the focal spot will possibly cover a set of at least two juxtaposed elementary detectors when the matrix array 23 is formed of a row of elementary detectors, and a set of at least four juxtaposed elementary detectors when the matrix array 23 is formed of a plurality of rows of elementary detectors. Because the imaging device according to the present invention is intended to detect a plurality of wavelengths, the minimum detection wavelength $\lambda_{min}$ will possibly be used to estimate the diameter $\varphi$ of the diffraction spot and the focal depth.

As illustrated in FIG. 2B, the matrix array 24 of elementary metallo-dielectric guided-mode-resonance filters is arranged in front of the detection matrix array 23 at a given distance d, which is for example smaller than the focal depth, this making it possible to avoid excessive divergence of the beams level with each elementary filter.

Moreover, the dimensions of the elementary filters are chosen so that each elementary focal spot formed at each point of the image field covers at least two elementary filters, these two elementary filters being optimized for passband transmission in spectral bands centered on two different central wavelengths, equal to two detection wavelengths. Thus, level with each elementary focal spot, elementary detectors receive a light flux that has been filtered, in spectral bands centered on different detection wavelengths.

For example, FIG. 2B shows a schematic of a two-dimensional matrix array 24 of elementary filters 24$i$. In this example, zones Zi formed of 4 elementary filters each optimized for detection in a spectral band centered on a different detection wavelength may be defined. In practice, a focal spot of the image-forming optic, formed on the matrix array 24 of filters and for example computed using the smallest of the detection wavelengths, will possibly cover a circular zone inscribed in the frame Zi.

In practice, the dimensions of an elementary filter may be substantially the same as those of an elementary detector, as is illustrated in FIG. 2B. However, it is also entirely possible for an elementary filter to be slightly larger or slightly smaller than an elementary detector.

For example, an elementary filter may have dimensions such that it covers a group of two elementary detectors (case of a 1D detection strip) or a group of 4 elementary detectors (case of a 2D detection matrix array) provided that the matrix array of elementary filters is located in the focal depth of the image-forming optic and that, in an elementary focal spot, there are at least two elementary filters suitable for transmission in spectral bands centered on two separate detection wavelengths.

Generally, it is possible to define zones Zi formed of a higher number of elementary filters, the filters being identical or different, but each zone Zi comprising at least two elementary filters optimized for passband transmission in spectral bands centered on two different central wavelengths, equal to two detection wavelengths. The elementary filters may be arranged in a given arrangement in each zone Zi. The zones Zi may all be identical, as in the example of FIG. 2B. Advantageously, the focal spot is sufficiently small to be contained in one zone Zi so that there is no "overflow" from one zone to the next. For example, the focal spot is of circular shape, and inscribed in one zone Zi.

As specified above, an elementary metallo-dielectric guided-mode-resonance (GMR) filter comprises a waveguide made of dielectric material and at least one metallic grating, which is structured with a given pattern, which is repeated with a given period, for coupling an incident wave to the guided mode of the waveguide. Thus, even when the dimension of an elementary filter is substantially equal to that of an elementary detector, as illustrated in FIG. 2B, as the dimension of an elementary filter is in practice a multiple of the dimension of a pattern of a metallic grating, the elementary filter will possibly be slightly larger or slightly smaller than an elementary detector, the difference being smaller than the detection wavelength.

As may be seen in FIG. 2A, the elementary filters 24$i$ receive convergent light beams $F_0$, $F_1$, the convergence of the beams at the field edge (beam $F_1$) being greater than at the center of the field (beam $F_0$). It is possible in particular to define a field-edge angle $\alpha$, defined as the angle of the most inclined ray intended to reach the matrix array of elementary detectors with respect to the direction normal to said matrix array of elementary detectors. This angle depends on the dimension of the matrix array of elementary detectors, on the aperture number and on the focal length of the image-forming optic. More precisely, it is possible to define the field-edge angle $\alpha$ by:

$$\alpha = \arctan\left(\frac{n_{pix} t_{pix} + D}{2F}\right) \quad (3)$$

where $n_{pix}$ is the maximum number of detection pixels (in one dimension), and $t_{pix}$ is the pitch of the pixel.

For example, for a number of detection pixels in one row $n_{pix}$=640, a pixel pitch $t_{pix}$=15 µm, a diameter of the forming optic D=25 mm and a focal length F=50 mm, a field-edge angle $\alpha$=19° is obtained.

Thus, all or some of the elementary filters, and in particular the elementary filters positioned on the field edge, will possibly have an angular acceptance higher than or equal to the field-edge angle of the device.

Various elementary metallo-dielectric guided-mode-resonance (GMR) filters known in the prior art may be used for the implementation of a device for multispectral imaging in the infrared according to the present description.

The dimensioning of the GMR filters used for the spectral filtering in the infrared in a multispectral imaging device according to the present description will possibly comprise the following steps.

The detection wavelengths $\lambda_{di}$ and the widths $\Delta\lambda_1$ of the detection spectral bands at the detection wavelengths in question are defined depending on the application. For example, for the detection of one particular chemical species, it will possibly be advantageous to seek a narrow detection spectral bandwidth (narrower than 0.5 µm) whereas for other applications, for example evaluation of the emissivity of a body, it will possibly be advantageous to seek a wider detection spectral bandwidth (larger than 1 µm).

The characteristics of the detection matrix array: detection strip or two-dimensional matrix array, number of pixels ($n_{pix}$) in each direction and size of one pixel ($t_{pix}$), are also set depending on the application.

The opto-geometric characteristics of the device, in particular the aperture number N and the focal length F of the image-forming optic are chosen depending on the scene to be observed, on the detector (spatial resolution) and on the required maximum bulk of the device.

How the elementary filters may be chosen and dimensioned, depending on the sought detection wavelengths $\lambda_{di}$, on the width $\Delta\lambda_i$ of the detection spectral band at the detection wavelength in question and on the opto-geometric parameters of the detection device, is defined below. In particular, it will be possible to decide upon, in a given matrix array of elementary filters, one or more types of filters (DMG, bi-atomic, etc.), as will be described below.

For each type of filter, it is sought to determine the geometric parameters of the filter allowing the optical characteristics sought for the filter, namely the maximum transmittance $T_{max}$, the resonant wavelength $\lambda_r$, the width of resonance $\Delta\lambda$ and the angular acceptance $\Delta\theta$. In practice, the sought resonant wavelength $\lambda_r$, which corresponds to the central wavelength of the transmission spectral band at which the transmittance is maximum $T_{max}$, will be equal to a detection wavelength $\lambda_{di}$. The sought width of resonance $\Delta\lambda$, which corresponds to the full width at half maximum of the spectral response of the filter in transmission, will be equal to the width $\Delta\lambda_{di}$ of the detection spectral band, and the sought angular acceptance $\Delta\theta$ will possibly be defined depending on the field-edge angle $\alpha$ of the device (see equation (3) above).

As regards the angular acceptance $\Delta\theta$ of the elementary filters, it will possibly advantageously be chosen to be greater than the field-edge angle $\alpha$ for all of the filters of the matrix array or at the very least for some of the filters located at the field edge. If the angular acceptance $\Delta\theta$ is less than the field-edge angle $\alpha$, the filter continues to operate but its effectiveness decreases since the transmittance at resonance $T_{max}$ decreases and the quality factor $Qi=\lambda_{di}/\Delta\lambda_i$ may be degraded.

The determination of the parameters of the elementary filters, once a type of filter has been chosen, will possibly comprise the following steps: (1) choice of the first parameters, (2) verification of the first parameters by numerical simulation (simulation of the transmittance as a function of wavelength and simulation of the transmittance as a function of angle of incidence) and (3) modification of the parameters depending on the results of the simulation.

For the step (2) of verifying the first parameters by numerical simulation, a simulation of the transmission of the filter with a convergent beam may be carried out. It comprises decomposing the incident convergent beam into plane waves of different angles of incidence, simulating the propagation of each elementary plane wave and summing the elementary plane waves after propagation. The applicants have however demonstrated that a simulation of the transmission of the filter "with plane waves" may be used, because the parameters obtained with a simplified numerical simulation with plane waves were substantially similar to those obtained by means of a simulation of the transmittance with convergent beams, provided that the angle of incidence of the wave remains in the range of angular tolerance of the filter.

In any case, various known methods will possibly be used to simulate responses of elementary filters to incident electromagnetic waves. It is for example possible to use a modal computational method such as rigorous coupled-wave analysis (RCWA), which is for example described in M. G. Moharam et al. JOSAA 12, 1068 (1995). It is also possible to use finite-element methods (FEMs) implemented for example in the COMSOL Multiphysics® software package or finite-difference time-domain (FDTD) methods implemented in a LUMERICAL® software package. The curves presented in the rest of the description were computed using a modal computational method, and more particularly using the Reticolo computational code for Matlab® (P. Hugonin and P. Lalanne, "*Reticolo software for grating analysis*", Institut d'Optique, Orsay, France (2005)), assuming plane waves and a one-dimensional pattern (slits-).

As described above, an elementary metallo-dielectric guided-mode-resonance filter optimized for passband transmission in a spectral band centered on a given resonant wavelength $\lambda_r$ comprises, in the context of the present description, a layer made of dielectric material (refractive index $n_d$ and thickness $t_d$) forming a waveguide able to support only a single mode at said wavelength, and at least one metallic diffraction grating (refractive index $n_m$ and thickness $t_m$) structured with a given pattern, which is repeated with a given period (p), which is lower than said resonant wavelength. The diffraction grating is suitable for coupling an incident wave at the resonant wavelength to the guided mode. The pattern may comprise one or more apertures of given dimensions, the apertures possibly being two-dimensional (crosses or circular apertures for example) or one-dimensional (slits). The apertures are filled with a dielectric material, which may be ambient air or another dielectric material such as for example the dielectric material forming the waveguide or that forming the substrate, depending on which of the various types of filters it is a question.

Three examples of designs of elementary metallo-dielectric guided-mode-resonance filters for producing a multispectral imaging device according to the present description are given below. These examples are nonlimiting, other geometries being usable to produce elementary guided-mode-resonance filters. In each case, a similar method may be applied to define the parameters of the filter.

A first example is described with reference to FIGS. 3A-3C.

Figure 3A:
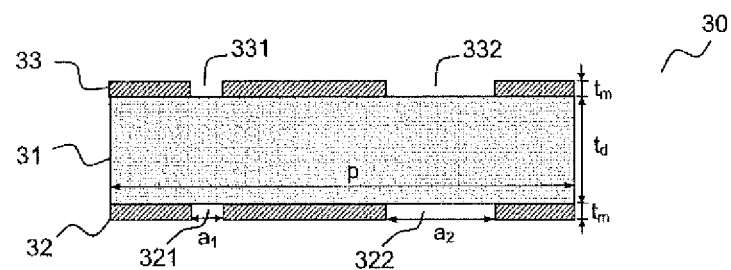
FIG. 3A shows an example of an embodiment of a suspended bi-atomic DMG metallo-dielectric GMR filter suitable for a device for multispectral imaging in the infrared according to the present description.

In FIG. 3A, only one pattern of one elementary filter 30 of dimension p has been shown. In practice, the elementary filter comprises a repetition of the pattern thus shown to form a diffraction grating having a period p.

The elementary filter 30 illustrated in FIG. 3A is a suspended dual metallic grating (DMG). It comprises a layer 31 made of dielectric material forming a waveguide that is able to support only a single mode at the resonant wavelength $\lambda_r$, and two metallic diffraction gratings 32, 33, which are arranged on either side of the layer made of dielectric material, the DMG being suspended in a fluid such as air or in vacuum. Each metallic grating is structured with a given pattern, which is repeated with a given period p, which is lower than the resonant wavelength wavelength. More precisely, in the example of FIG. 3A, the first metallic grating 32 comprises a pattern with two slits 321, 322 of respective widths $a_1$ and $a_2$ and the second metallic grating 33 comprises a pattern with two slits 331, 332 of respective widths $a_1$ and $a_2$ identical to those of the slits of the pattern of the first grating.

In the example of FIG. 3A, the metallic gratings are said to be "bi-atomic" because they comprise two slits of different widths per pattern. Such a type of elementary bi-atomic DMG filter is for example described in E. Sakat et al. 2013. It will however be noted that although these filters are advantageous from the point of view of angular acceptance, it is however possible to also design a multispectral imaging device employing "monatomic" elementary suspended DMG filters, i.e. filters in which a pattern of a metallic diffraction grating comprises only one slit, as for example described in C. Tardieu et al., Optics Letters 40, 4 (2015).

In the step (1) of determining the first parameters, the thickness and refractive index $t_g$ and $n_g$ of the waveguide are firstly chosen. $t_g$ and $n_g$ are chosen to be sufficiently small that the waveguide is able to support only a single mode at the desired resonant wavelength $\lambda_r$. They thus respect the condition:

$$0 < \frac{2}{\lambda_r t_d (n_d^2 - 1)^{1/2}} < 1 \quad (4)$$

Next, the period p and the index $n_g$ of the dielectric are adjusted so that a plane wave at normal incidence at the resonant wavelength is diffracted in only 3 orders in the waveguide and only in the order 0 in free space (incident medium or transmission medium). To achieve this, the known laws of transmission gratings are applied.

It is then possible to adjust the width of the slits, bearing in mind that in this case two slits of different widths ($a_1 \neq a_2$) are sought. Wide slits allow a high transmittance at resonance to be obtained but decrease the quality factor. To obtain a narrower resonance, narrower slits are required.

In practice, the applicants have shown that, at the detection wavelengths of interest (for example between 3 μm and 5 μm), the parameters of the filters may be chosen from the following ranges of values:

metallic gratings 32, 33 made of gold (Au), silver (Ag), or copper (Cu);

$t_m$ comprised between $\lambda_r/100$ and $\lambda_r/10$;

$p < \lambda_r$;

$a_1 < \lambda_r/4$, $a_2 < \lambda_r/4$, $a_1 \neq a_2$;

dielectric material, for example silicon carbide (SiC) or silicon nitride (SiN);

$t_d$ comprised between $\lambda_r/20$ and $\lambda_r/2$.

For a spectral range of the longest wavelengths, for example in the 8-12 μm range, the typical dimensions will naturally be larger.

In step (2), the optical characteristics of each filter with the first chosen parameters are verified using numerical simulations.

To do this, the transmission spectrum of this filter is computed in order to obtain the maximum transmittance in the simulated wavelength range and its position in wavelength (FIG. 3B), which corresponds to the value $T_{max}$ of the transmittance at resonance of the filter and to the resonant wavelength $\lambda_r$, respectively. The full width at half maximum $\Delta\lambda$ of the resonance is also obtained. The variation in the transmittance at the determined wavelength $\lambda_r$ as a function of the angle of incidence of the plane wave is also computed. The angular tolerance $\Delta\theta$ of the filter, which corresponds to the angle at which the transmittance drops to half its value at normal incidence, is deduced therefrom.

Figures 3B, 3C:
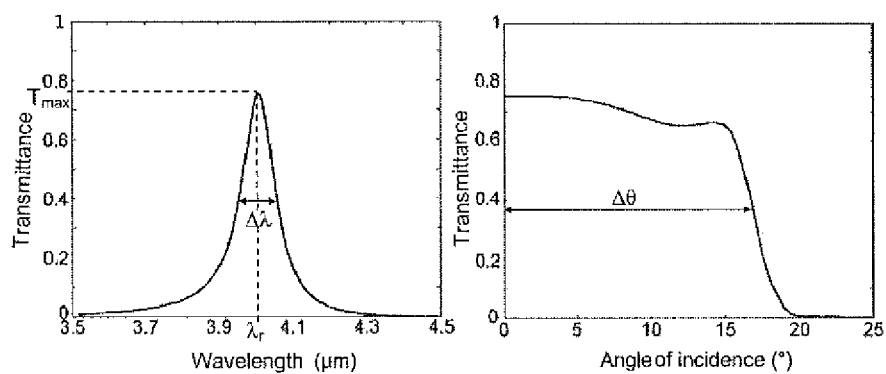
FIGS. 3B and 3C show two curves of results of simulations of transmittance as a function of wavelength and as a function of angle of incidence (with plane waves) in the case of an example of a bi-atomic suspended DMG filter (FIG. 3A)

The curves shown in FIGS. 3A and 3B thus illustrate the transmittance as a function of wavelength and the transmittance as a function of angle of incidence for a guided-mode-resonance filter such as that illustrated in FIG. 3A with the following parameters:

period p=3 μm, $a_1$=0.2 μm, $a_2$=0.7 μm, $t_m$=0.1 μm and $t_d$=0.65 μm, $n_d$=2.15 (SiNx) and $n_m$ is given by a Drude model for gold.

The simulations give for this filter: $\lambda_r$=4.01 μm, $T_{max}$=75%, $\Delta\theta$=17° and $\Delta\lambda$=120 nm.

Depending on the sought characteristics, the step (3) of designing the filters comprises potentially modifying the parameters for optimization purposes. It is for example possible to obtain a lower resonant wavelength by decreasing the period p. It is possible to obtain a higher angular tolerance by increasing the index of the guide. It is possible to obtain a spectrally narrower resonance by decreasing the width of the two slits. However, each time a parameter is modified to change the value of one of the optical characteristics, it is necessary to readjust the other parameters as otherwise there is a risk that another of the optical characteristics will be degraded. It is also possible to use an optimization algorithm to find the best parameters, such as for example particle swarm optimization (Mehrdad Shokooh-Saremiand et al., "*Particle swarm optimization* and its application to the design of diffraction grating filters" Opt. Lett. 32, 894-896 (2007)).

A second example is described with reference to FIGS. 4A-4C.

Figure 4A:
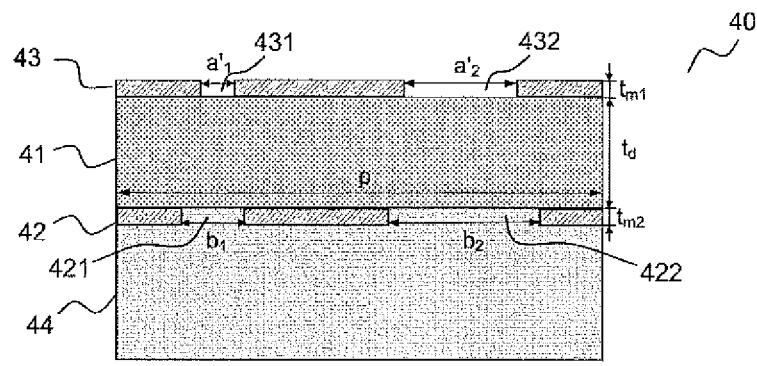
FIG. 4A shows an example of an embodiment of an on-substrate bi-atomic DMG metallo-dielectric GMR filter suitable for a device for multispectral imaging in the infrared according to the present description.

In FIG. 4A as in FIG. 3A, only one pattern of one elementary filter 40 of dimension p has been shown. In practice, the elementary filter comprises a repetition of the pattern thus shown to form a diffraction grating having a period p.

The elementary filter 40 illustrated in FIG. 4A is a bi-atomic dual-metallic-grating (DMG) filter with a substrate. It comprises a layer made of dielectric material 41 (thickness $t_d$, refractive index $n_d$) forming a waveguide that is able to support only a single mode at the resonant wavelength $\lambda_r$, and two metallic diffraction gratings 42, 43 (thicknesses $t_{m1}$, $t_{m1}$, refractive indices $n_{m1}$, $n_{m2}$) arranged on either side of the layer made of dielectric material. It furthermore comprises a substrate 44 of refractive index $n_{sub}$ ($n_{sub}<n_d$) on which are deposited, in this example, the layer 41 made of dielectric material and the metallic diffraction grating 42. Each metallic grating is structured with a given pattern, the pattern being repeated for each grating with a given period p that is lower than the resonant wavelength. More precisely, in the example of FIG. 4A, the first metallic grating 32 comprises a pattern with two slits 421, 422 of respective widths $b_1$ and $b_2$ and the second metallic grating 43 comprises a pattern with two slits 431, 432 of respective widths $a'_1$ and $a'_2$.

In practice, to obtain a first estimation of the parameters, with a view to obtaining the sought characteristics, it is possible to start with a suspended DMG filter such as illustrated in FIG. 3A. A suitable substrate is then chosen and the widths of the slits of the grating making contact with the substrate are adjusted. A substrate of the lowest possible refractive index and a waveguide of high refractive index are sought in order to preserve a single-mode waveguide. The period p is chosen such that only the order 0 diffracted by the gratings propagates through the substrate, as for the suspended guide. In this example, contrary to the example of FIG. 3A, the widths and/or thicknesses of the slits of the grating 42 are different from those of the grating 43 in order to compensate for the change of index of the substrate. Such a filter is for example described in C. Tuambilangana et al., Optics Express 23, 25 (2015).

As above, although bi-atomic metallic gratings are illustrated in the example of FIG. 4A, it would also be possible to optimize the parameters for monatomic on-substrate DMG filters.

Figures 4B, 4C:
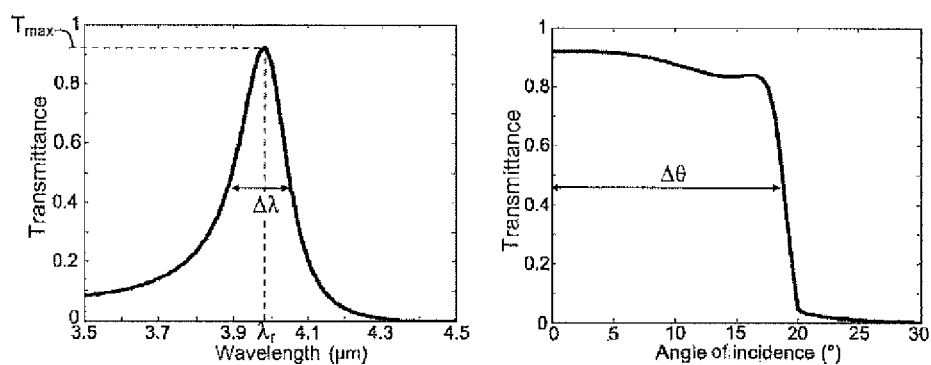
FIGS. 4B and 4C show two curves of results of simulations of transmittance as a function of wavelength and as a function of angle of incidence (with plane waves) in the case of an example of an on-substrate bi-atomic DMG filter (FIG. 4A)

The curves illustrated in FIGS. 4A and 4B (step 2) illustrate the transmittance as a function of wavelength and the transmittance as a function of angle of incidence for a guided-mode-resonance filter such as that illustrated in FIG. 4A with the following parameters: period p=2 µm, $a_1$=0.12 µm, $a_2$=0.62 µm, $b_1$=0.15 µm, $b_2$=0.65 µm, $t_{m1}$=0.1 µm, $t_{m2}$=0.05 µm, $t_d$=0.6 µm, $n_g$=2.84 (SiC) and $n_m$ is given by a Drude model for gold.

The simulations give for this filter: $\lambda_r$=3.98 µm, $T_{max}$=92%, $\Delta\theta$=20° and $\Delta\lambda$=160 nm.

A step (3) of modifying the parameters in order to optimize the parameters depending on the sought characteristics may be carried out as described above.

A second example is described with reference to FIGS. 5A-5C.

In FIG. 5A as in FIG. 3A, only a single pattern of one elementary filter 50 of dimension p has been shown. In practice, the elementary filter comprises a repetition of the pattern thus shown to form a diffraction grating having a period p.

The elementary filter 50 illustrated in FIG. 5A is of the type with a single metallization on its front face, and with a substrate. It comprises a layer 51 made of dielectric material (thickness $t_d$, refractive index $n_d$) forming a waveguide that is able to support only a single mode at the resonant wavelength $\lambda_r$, and two metallic diffraction gratings 52, 33 (thickness $t_{m1}$ and $t_{m2}$, refractive index $n_m$), this time arranged on the same side of the layer made of dielectric material. It furthermore comprises a substrate 54 of refractive index $n_{sub}$ ($n_{sub}<n_g$) on which the layer 51 made of dielectric material is deposited (substrate on the side opposite to the side bearing the gratings). Each metallic grating is structured with a given pattern, which is repeated for each grating with a given period p, which is lower than the resonant wavelength. More precisely, in the example of FIG. 5A, the first metallic grating 52 comprises a pattern with two slits 521 of identical widths $b'_1$ and the second metallic grating 53 comprises a pattern with a single slit 531 of width $a''_1$.

In practice, to obtain a first estimation of the parameters, with a view to obtaining the sought characteristics, it is possible to also start with a suspended DMG filter such as illustrated in FIG. 3A (but in a mon-atomic configuration). A suitable substrate is then chosen and the width and thickness of the single slit of each grating is adjusted in order to change the quality factor and the angular tolerance.

The curves illustrated in FIGS. 5A and 5B (step 2) illustrate the transmittance as a function of wavelength and the transmittance as a function of angle of incidence for a guided-mode-resonance filter such as that illustrated in FIG. 5A with the following parameters: period p=1.5 µm, $a''_1$=0.2 µm, $b'_1$=0.1 µm, $t_{m1}$=0.1 µm, $t_{m2}$=0.13 µm, $t_d$=0.63 µm, $n_d$=2.15 (SiNx) and $n_m$ is given by a Drude model for gold.

The simulations give for this filter: $\lambda_r$=3.89 µm, $T_{max}$=70%, $\Delta\theta$=15° and $\Delta\lambda$=320 nm.

A step (3) of modifying the parameters in order to optimize the parameters depending on the sought characteristics may be carried out as described above.

The applicants have demonstrated that the metallo-dielectric GMR filters described above are able to work with a convergent beam, and over areas of the size of the detection pixel.

Figure 6A:
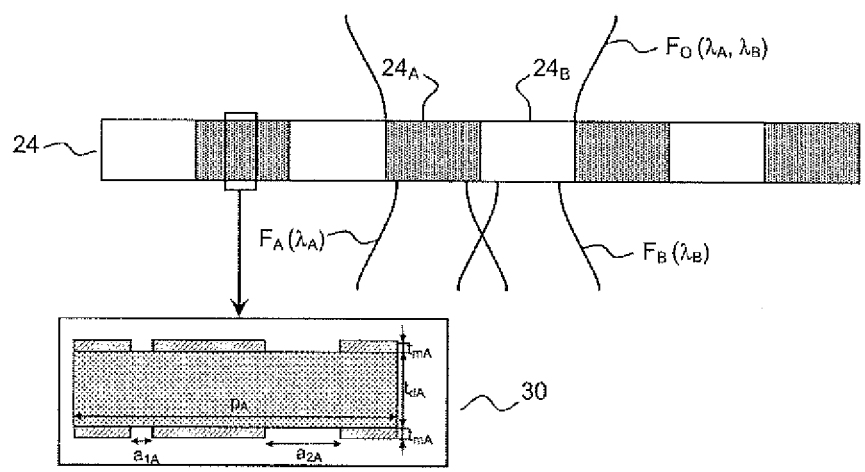
FIGS. 6A and 6B show the schematic of an example of an embodiment of a matrix array of filters that is suitable for a device for multispectral imaging in the infrared according to the present description, comprising suspended bi-atomic DMG metallo-dielectric GMR filters, and results of a simulation showing the confinement of the field in the matrix array of filters when illuminated with a convergent beam.

FIG. 6A thus illustrates a cross-sectional view of a matrix array 24 of elementary guided-mode-resonance filters comprising, in this example, elementary filters $24_A$, $24_B$, each suitable for resonant transmission in a spectral band centered on the wavelengths $\lambda_A$, $\lambda_B$, respectively. In this example, the matrix array 24 is formed of a row of elementary filters and suitable for the filtering required in an infrared multispectral imaging device equipped with a strip of elementary detectors. However, it could equally well be a question of a 2D matrix array of elementary filters suitable for the filtering required in an infrared multispectral imaging device equipped with a 2D matrix array of elementary detectors. Each filter comprises a diffraction grating formed of a few periods of a pattern, such that the dimensions of a filter are substantially the same as the dimensions of a pixel.

The behavior of the filters under a focused beam $F_0$ has been studied, the light beam $F_0$ comprising an entire range of wavelengths, including the wavelengths $\lambda_A$, $\lambda_B$. The applicants have shown that the spread of the electric and magnetic fields in the waveguide at resonance is limited, the electromagnetic field being localized at the wavelength $\lambda_A$ in the filter $24_A$ and at the wavelength $\lambda_B$ in the filter $24_B$. Thus, as output from the matrix array of filters, beams $F_a$ and $F_b$ at the central wavelengths $\lambda_A$ and $\lambda_B$ are respectively obtained.

Figure 6B:
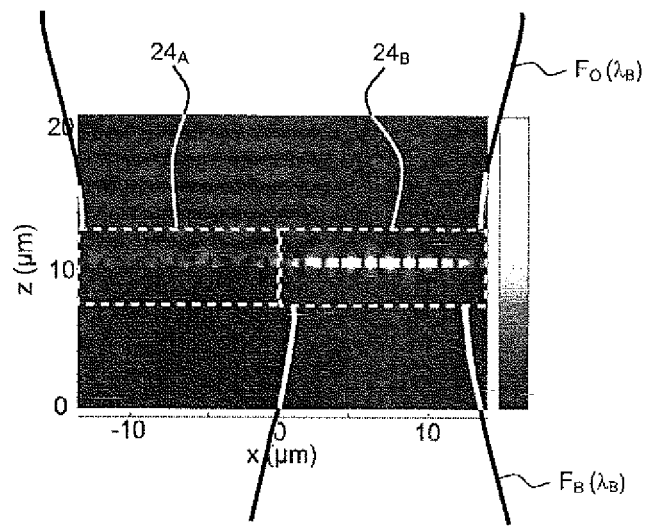

FIG. 6B thus shows the results of a numerical simulation computing the intensity of the magnetic field within an elementary filter, the simulation being carried out with a matrix array of elementary filters such as shown in FIG. 6A. For this simulation, each filter $24_A$, $24_B$ was a suspended bi-atomic DMG filter (as for example illustrated in FIG. 3A) optimized for resonant wavelengths of $\lambda_A=4$ µm and $\lambda_B=4.7$ µm, respectively. The insert 30 in FIG. 6A illustrates in detail a filter $24_A$, limited to one pattern. The characteristics of the filters were the following. For the filter $24_A$, period $p_A=3$ µm, number of periods=5, width of the slits $a_{1A}=0.2$ µm, $a_{2A}=0.5$ µm. For the filter 24B, period $p_A=3.7$ µm, number of periods=4, width of the slits $a_{1B}=0.1$ µm, $a_{2B}=0.7$ µm. For both filters $24_A$, $24_B$, the simulation was carried out with a layer made of dielectric material formed of SiN and a metallic grating made of Au. Moreover, $t_{mA}=t_{mB}=0.1$ µm and $t_{dA}=t_{dB}=0.65$ µm.

For the simulation, the filters were illuminated with a focused beam $F_0$ of opening half-angle of 9° and at the wavelength $\lambda_B$. It may be seen that, though it is a question of guided-mode-resonance filters, the electromagnetic field is indeed localized in filter B and that only it transmits the incident radiation.

A matrix array of elementary metallo-dielectric guided-mode-resonance filters suitable for a multispectral imaging device according to the present description may be manufactured using known processes, such as for example described in the articles referenced in the present description. The matrix array may be deposited on a substrate or suspended.

The arrangement of the matrix array of elementary filters in proximity to the matrix array of elementary detectors may then be achieved in various ways. The matrix array of elementary filters may for example be arranged without adhesive bonding with spacers. It may also be adhesively bonded, by means of an adhesive that is transparent in the filtering wavelength range. In order to prevent reflections at the interfaces of the substrate or of the adhesive, an antireflection layer may be added if necessary. The adhesive bonding may be achieved in a number of ways. For example, the filter may be flipped and the upper portion with the gratings may be adhesively bonded to the matrix array of detectors. However, according to another example, in the case of an on-substrate filter, the typical thickness of which (larger than 300 µm) is generally larger than the focal depth, it is possible to thin the substrate via a mechanical polish or a chemical etch and to adhesively bond the substrate to the matrix array of detectors.

Although described by way of a certain number of detailed examples of embodiments, various variants, modifications and improvements to the infrared multispectral imaging method and device according to the present description will appear obvious to those skilled in the art, and it will be understood that these various variants, modifications and improvements form part of the scope of the invention, such as defined by the following claims.

The invention claimed is:

1. A device for multispectral, infrared imaging suitable for detecting at least first and second detection wavelengths, the device comprising:
a detection matrix array comprising a set of elementary detectors of preset dimensions forming an image field of given dimensions;
an image-forming optic having a given aperture number (N) and a given focal length (F), said number and length being suitable for forming, at every point of the image field, an elementary focal spot, said focal spot covering a set of at least two juxtaposed elementary detectors; and
a matrix array of elementary metallodielectric guided-mode-resonance filters, said matrix array being arranged in front of the detection matrix array at a distance smaller than a focal depth of the image-forming optic, dimensions of the elementary filters being chosen so that each of the focal spots covers at least two of the elementary filters, said at least two elementary filters being optimized for passband transmission in spectral bands centered on two different central wavelengths, equal to two of said first and second detection wavelengths,
wherein at least one of the elementary filters has an angular acceptance measured in plane waves higher than or equal to a field-edge angle of the device, the field-edge angle being defined as an angle of a most inclined ray intended to reach the detection matrix array of the set of elementary detectors with respect to a direction normal to the detection matrix array of the set of elementary detectors.

2. The device for multispectral imaging in the infrared as claimed in claim 1, wherein each of said elementary filters has dimensions substantially identical to those of one elementary detector.

3. The device for multispectral imaging in the infrared as claimed in claim 1, wherein said elementary filters of the matrix array are arranged in a form of zones (Zi), each zone comprising at least two elementary filters optimized for passband transmission in spectral bands centered on two different central wavelengths, and having dimensions larger than those of the respective focal spot.

4. The device for multispectral imaging in the infrared as claimed in claim 1, wherein the matrix array of elementary filters comprises at least one elementary dual metallic grating (DMG) guided-mode-resonance filter comprising a waveguide made of dielectric material and two metallic gratings on either side of the waveguide made of the dielectric material.

5. The device for multispectral imaging in the infrared as claimed in claim 4, wherein the elementary DMG guided-mode-resonance filter is suspended and the two metallic gratings are identical.

6. The device for multispectral imaging in the infrared as claimed in claim 4, wherein the elementary DMG guided-mode-resonance filter is deposited on a substrate made of dielectric material and the two metallic gratings are different.

7. The device for multispectral imaging in the infrared as claimed in claim 1, wherein the matrix array of elementary filters comprises at least one elementary guided-mode-resonance filter with a single metallization on its front face, said at least one filter comprising a waveguide made of dielectric material deposited on a substrate and, on a face opposite the substrate, a double metallic grating.

8. The device for multispectral imaging in the infrared as claimed in claim 1, wherein the matrix array of elementary filters comprises at least one elementary guided-mode-resonance filter of "bi-atomic" type, in which said at least one metallic grating has a pattern with at least two apertures of different dimensions.

9. A method for multispectral, infrared imaging in the infrared suitable for detecting at least first and second detection wavelengths, the method comprising:

forming an image of a scene by means of an image forming optic of given aperture (N) and acquiring said image by means of a detection matrix array comprising a set of elementary detectors of preset dimensions forming an image field of given dimensions, the image-forming optic forming at every point of the image field an elementary focal spot covering a set of at least two juxtaposed elementary detectors; and filtering light beams focused by said image forming optic by means of a matrix array of elementary metallo-dielectric guided-moderesonance filters, said matrix array being arranged in front of the detection matrix array at a distance smaller than a focal depth of the image-forming optic so that each elementary focal spot formed at each point of the image field covers at least two of the elementary filters, said at least two elementary filters being optimized for passband transmission in spectral bands centered on two different central wavelengths, equal to two of said first and second detection wavelengths, wherein at least one of the elementary filters has an angular acceptance measured in plane waves higher than or equal to a field-edge angle of a device performing the imaging, the field-edge angle being defined as an angle of a most inclined ray intended to reach the detection matrix array of the set of elementary detectors with respect to a direction normal to the detection matrix array of the set of elementary detectors.

\* \* \* \* \*